United States Patent
Lee et al.

(10) Patent No.: US 10,971,562 B2
(45) Date of Patent: Apr. 6, 2021

(54) DISPLAY APPARATUS WITH TOUCH SENSOR HAVING SHIELD LAYER BETWEEN TOUCH SENSOR LINE AND DRIVING LINE

(71) Applicant: LG Display Co., Ltd., Seoul (KR)

(72) Inventors: HwiDeuk Lee, Gyeongsangbuk-do (KR); Yangsik Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/511,570

(22) Filed: Jul. 15, 2019

(65) Prior Publication Data
US 2020/0027929 A1  Jan. 23, 2020

(30) Foreign Application Priority Data
Jul. 20, 2018  (KR) ......................... 10-2018-0084990

(51) Int. Cl.
*H01L 27/32* (2006.01)
*H01L 51/52* (2006.01)

(52) U.S. Cl.
CPC ........ *H01L 27/323* (2013.01); *H01L 27/3248* (2013.01); *H01L 27/3276* (2013.01); *H01L 27/3297* (2013.01); *H01L 51/5206* (2013.01); *H01L 51/5221* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 2016/0141545 A1* | 5/2016 | Kim | ............ H01L 51/5253 257/40 |
| 2017/0047391 A1* | 2/2017 | You | ............ H01L 29/78606 |
| 2017/0365814 A1 | 12/2017 | Kim et al. | |
| 2018/0032189 A1* | 2/2018 | Lee | ............ G09G 3/3225 |
| 2018/0145114 A1 | 5/2018 | Sim et al. | |
| 2018/0175135 A1* | 6/2018 | Lim | ............ H01L 27/3272 |

FOREIGN PATENT DOCUMENTS

| | | |
|---|---|---|
| EP | 3 276 459 A1 | 1/2018 |
| EP | 3 291 063 A1 | 3/2018 |
| EP | 3 293 766 A1 | 3/2018 |

* cited by examiner

*Primary Examiner* — Erik Kielin
(74) *Attorney, Agent, or Firm* — Morgan, Lewis & Bockius LLP

(57) ABSTRACT

A display apparatus includes a substrate having active and non-active areas; data lines and gate lines on the substrate; a driving line in the non-active area; a plurality of pixels connected to the data lines and the gate lines, each pixel including: a light emitting diode, and a driving transistor with the driving line under a cathode of the light emitting diode in the non-active area; a shield layer between the cathode and the driving line; an encapsulation layer on the cathode; a touch electrode on the encapsulation layer in the active area, and a touch line on the encapsulation layer to supply a touch signal to the touch electrode. The driving line is below the touch line in the non-active area. The encapsulation layer has a sloped surface, and the touch line is on the sloped surface such that the touch line has a corresponding slope.

15 Claims, 14 Drawing Sheets

(a)

(b)

DISPLAY APPARATUS WITH TOUCH SENSOR HAVING SHIELD LAYER BETWEEN TOUCH SENSOR LINE AND DRIVING LINE

This application claims priority from Korean Patent Application No. 10-2018-0084990, filed on Jul. 20, 2018, which is hereby incorporated by reference for all purposes as if fully set forth herein.

BACKGROUND

Technical Field

The present disclosure relates to a display apparatus having a touch sensor.

Description of the Related Art

As the information society develops, the demand for display devices to display images is increasing in various forms. Various types of display devices, such as a liquid crystal display device (LCD), a plasma display device, and an organic light emitting display device (OLED), have been used for this purpose. The organic light emitting display device among these display devices has self-emission characteristics and has excellent response speed, viewing angle and color reproducibility, and can be manufactured to be thin.

The display device may operate in response to an input signal received through various input devices such as a keyboard and a mouse. The display device can input a user's command intuitively and conveniently by touching the screen using the touch panel. The touch panel may be disposed on the screen of the display device and allows the user to input a command of the user by touching a specific point on the screen of the display device. Such a touch panel may be embedded in the display device and integrated with the display device. A touch panel integrated in the display device may be referred to as a touch sensor.

A problem may occur in that the touch sensor recognizes a signal applied to display an image on a display device as noise. Particularly, when the thickness of the display device is reduced, the distance between the touch sensor and the lines disposed in the display device may be reduced, thereby resulting in a large capacitance between the touch sensor and the lines. As a result, the touch sensor may be greatly affected by noise, which may result in failure to correctly perform touch detection.

SUMMARY

Accordingly, embodiments of the present disclosure are directed to a display apparatus that substantially obviates one or more of the problems due to limitations and disadvantages of the related art.

An aspect of the present disclosure is to provide a display apparatus having a touch sensor with a thin thickness.

An another aspect of the present disclosure is to provide a display apparatus having a touch sensor for accurately processing touch detection.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises a substrate including an active area and a non-active area; a plurality of data lines and a plurality of gate lines on the substrate; a driving line in the non-active area configured to transfer a display driving signal to the active area; a plurality of pixels electrically connected to the plurality of data lines and the plurality of gate lines, each pixel including: a light emitting diode having an anode electrode, a light emitting layer, and a cathode, and a driving transistor configured to drive the light emitting diode, wherein the driving line is under the cathode in the non-active area; a shield layer between the cathode and the driving line; an encapsulation layer on the cathode; a touch electrode on the encapsulation layer in the active area, the encapsulation layer having a sloped surface; and a touch line on the encapsulation layer in the non-active area and configured to supply a touch signal to the touch electrode, wherein the driving line is below the touch line in the non-active area, and wherein the touch line is on the sloped surface of the encapsulation layer, thereby having a corresponding slope.

In another aspect, a display apparatus comprises a substrate defining an active area having a plurality of pixels therein and a non-active area having a driving line configured to transfer a display driving signal to the active area to drive the pixels; a touch electrode on the substrate corresponding to the active area; a touch line on the substrate corresponding to the non-active area and configured to supply a touch signal to the touch electrode, the driving line being below the touch line in the non-active area; and a shield layer between the touch line and the driving line.

In another aspect, a display apparatus comprises a substrate defining an active area having pixels therein and a non-active area having driving lines therein configured to transfer a display driving signal to drive the pixels; a thin film transistor on the substrate disposed corresponding to the active area; a first insulation film on the thin film transistor; an anode electrode on the first insulation film in the active area and connected to the thin film transistor through the first insulation film; a shield layer on the first insulation film in the non-active area; a first power line on the first insulation film in the non-active area and spaced apart from the shield layer; a light emitting layer on the anode electrode; a cathode electrode on the light emitting layer and connected to the first power line; a second insulation film on the cathode electrode; a touch electrode on the second insulation film in the active area; and a touch line on the second insulation film in the non-active area and configured to supply a touch signal to the touch electrode.

According to these embodiments, a display device including a touch sensor can reduce the influence of noise and can more accurately detect the touch. Further, a display device having a touch sensor can be implemented with a thin thickness or profile.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
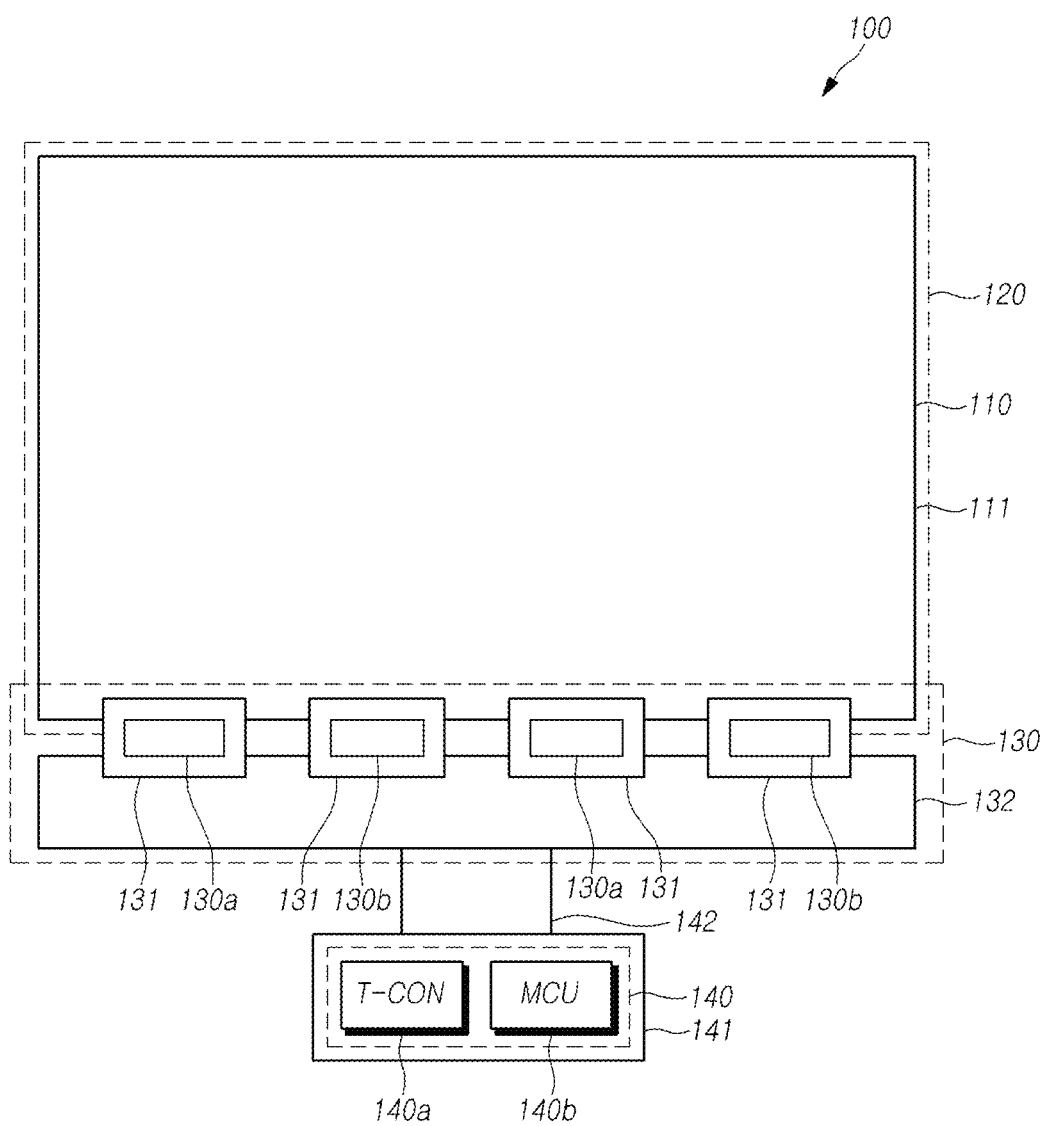
FIG. 1 is a structural diagram illustrating an embodiment of the display apparatus having the touch sensor according to the present embodiment.

Hereinafter, embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a structural diagram illustrating an embodiment of the display apparatus having the touch sensor according to the present embodiment.

With reference to FIG. 1, the display apparatus or the display device 100 may include a display panel 110, a touch sensor unit 120, a circuit unit 130, and a control unit 140. The display device 100 may be a liquid crystal display device or an organic light emitting display device, but is not limited thereto.

The display panel 110 may include a plurality of gate lines and a plurality of data lines are disposed to be intersected with each other and a plurality of pixels may be arranged in an area where the plurality of gate lines and the plurality of data lines cross each other. In the case that the display device 100 is an organic light emitting display device, each pixel of the display panel 110 may include a light emitting element and a pixel circuit (not shown) for supplying driving current to the light emitting element. The light emitting element may be an organic light emitting diode (OLED). The organic light emitting diode may include an organic layer, an anode electrode and a cathode electrode through which current flows in the organic layer. The pixel circuit may be connected to lines for transferring a power source or a signal.

The pixel circuit may be connected to the gate line for transferring the gate signal and the data line for transferring the data signal. In addition, the pixel circuit may receive the data signal in response to the gate signal, and may generate the driving current and supply the generated driving current to the organic light emitting diode. In addition, the pixel circuit may be connected to a separate power line (not shown) to be supplied the driving current. However, the lines connected to the pixel circuit may be not limited to this case. The gate signal and the data signal may be referred to as a display driving signal. However, the display driving signal is not limited thereto.

The touch sensor unit 120 may sense a touch point of the display panel 110. The touch sensor unit 120 may include a plurality of touch electrodes disposed on the display panel 110. The plurality of touch electrodes may be connected to the touch lines, and the touch signals may be transmitted to the touch lines or received from the touch lines. The touch signal may include a touch driving signal and a touch sensing signal. Here, the touch sensor unit 120 is shown as one component on the display panel 110, but is not limited thereto.

The circuit unit 130 may transmit the display driving signal and the touch signal to the display panel 110 and the touch sensor unit 120, respectively. The circuit unit 130 may include a drive IC (Integrated Circuit) 130a for supplying the display driving signal and a touch IC 130b for transmitting and receiving the touch signal.

The drive IC 130a may include a gate driver for outputting the gate signal and a data driver for outputting the data signal. The drive IC 130a may receive the gate control signal and the data control signal. The gate driver and the data driver included the driver IC 130a are operated with the gate control signal and the data control signal, respectively. In the case that the display panel 110 is implemented in the form of the gate in panel (GIP), the gate driver may control the gate in panel (GIP) to receive the control signals from the gate driver and the gate in panel (GIP) generate the gate signal and deliver the gate signal to the gate lines. The gate control signal may include a clock, a start pulse, a synchronization signal, but is not limited thereto.

The touch IC 130*b* may receive a touch control signal and may transmit and receive the touch signal to and from the touch sensing unit 120. The touch signal may include the touch driving signal and the touch sensing signal.

For example, the number of the drive IC 130*a* and the number of the touch IC 130*b* may be two, respectively, but is not limited thereto. The drive IC 130*a* and the touch IC 130*b* are shown alternately arranged, but is not limited thereto. The number of the drive IC 130*a* and the number of the touch IC 130*b* may be two, respectively, but is not limited thereto. The number of the driver IC 130*a* and the number of the touch IC 130*b* are shown to be the same, but the present embodiment is not limited thereto. The number of the drive IC 130*a* and the touch IC 130*b* may be determined depending on the size and/or resolution of the display panel 110 and the size of the touch sensor unit 120. In addition, the circuit unit 130 may be implemented in such a manner that the drive IC 130*a* and the touch IC 130*b* are disposed on a flexible printed circuit board (FPCB) 131, respectively. The FPCB 131 may be connected to the substrate 111 and the source printed circuit board (SPCB) 132 so that the driving control signal and the touch control signal transmitted through the SPCB 132 are respectively supplied to the drive IC 130*a* and the touch IC 130*b*. However, the arrangement of the circuit unit 130 is not limited to this, and the circuit unit 130 may be disposed in one area on the substrate 111. The substrate 110*a* may be flexible.

The control unit 140 may control the drive IC 130*a* and the touch IC 130*b*. The control unit 140 may output the driving control signal and the touch control signal. The control unit 140 may include the driving control unit 140*a* and the touch control unit 140*b*. The driving control unit 140*a* may be a T-CON (timing controller), and the touch control unit 140*b* may be an MCU (micro control unit). The driving control unit 140*a* and the touch control unit 140*b* may be disposed on a CPCB (Control Printed Circuit Board) 141 and the CPCB 141 may be connected to the circuit unit 130 through an FFC (flexible flat circuit) 142, but is not limited thereto.

Figure 2:
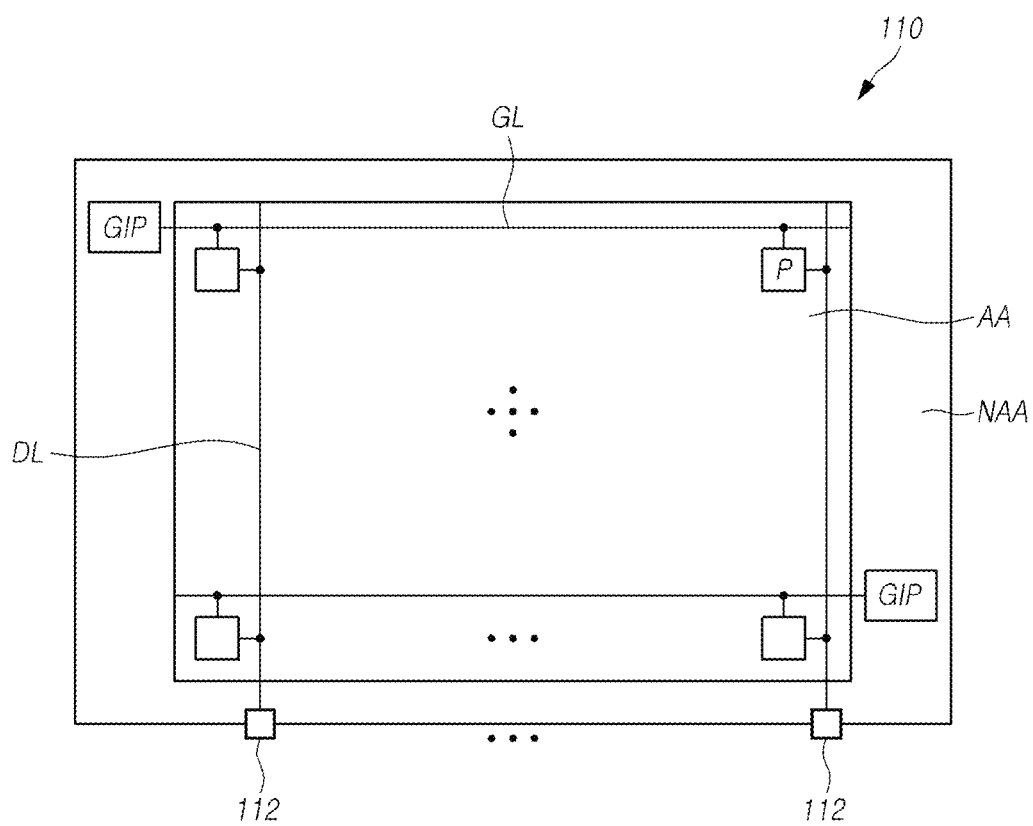
FIG. 2 is a plan view illustrating an embodiment of the display panel shown in FIG. 1.

FIG. 2 is a plan view illustrating one embodiment of the display panel shown in FIG. 1.

With reference to FIG. 2, the display panel 110 may include a substrate 111 on which the active area (AA) and the non-active area (NAA) may be disposed. The material of the substrate 111 may include plastic or glass. However, the present invention is not limited thereto. The active area (AA) may be disposed at the center of the substrate 111 and the non-active area (NAA) may be formed at the edge of the substrate 111, but is not limited thereto.

The plurality of pixels (P) may be arranged in the active area (AA) to display an image. A touch electrode may be disposed on the active area (AA). The gate-in-panel (GIP) may be disposed in the non-active area (NAA) and the gate-in-panel GIP may transfer the gate signal to the pixels in response to the signal received from the circuit unit 130 shown in FIG. 1.

The power line, the clock line, the gate line, the data line and the touch line may be disposed in the non-active area (NAA). The power line, the clock line, the gate line, the data line and the touch line may be referred to as a driving line, but is not limited thereto. In addition, the light emitting layer and the cathode electrode included in the pixel may be disposed in the non-active area (NAA).

The pad 112 may be disposed below the non-active area (NAA) of the substrate 111 of the display panel 110. The pad 112 may be connected to the circuit unit 130 and may transmit and receive signals to and from the circuit unit 130 shown in FIG. 1. The area in which the pad 112 is disposed may be referred to as the pad area. The pad 112 may be connected to the data line (DL), but is not limited thereto. The pad 112 may be disposed to correspond to all the lines for transmitting and receiving signals to and from the circuit unit 130 shown in FIG. 1.

Figure 3A:
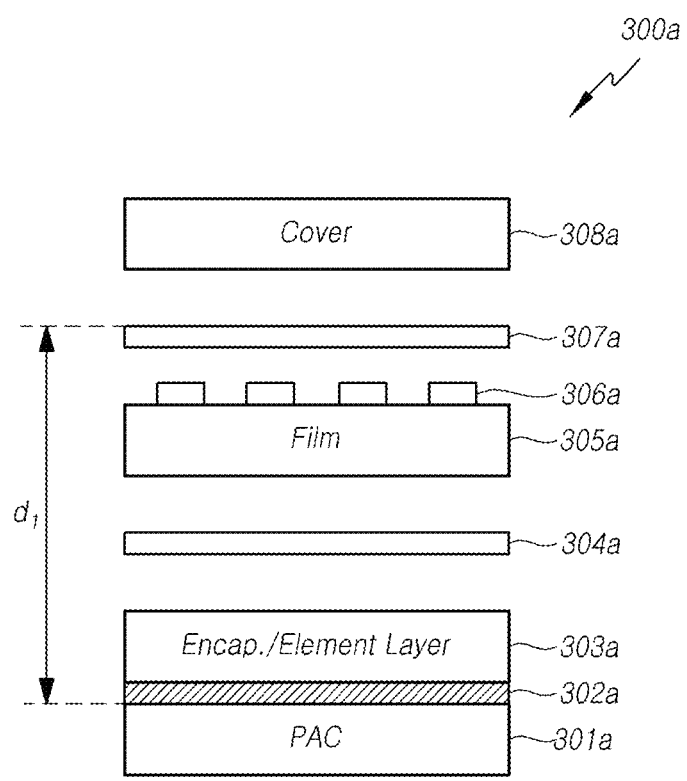
FIG. 3A is a cross-sectional diagram illustrating a first embodiment of the display device according to embodiments of the present invention.
Figure 3B:
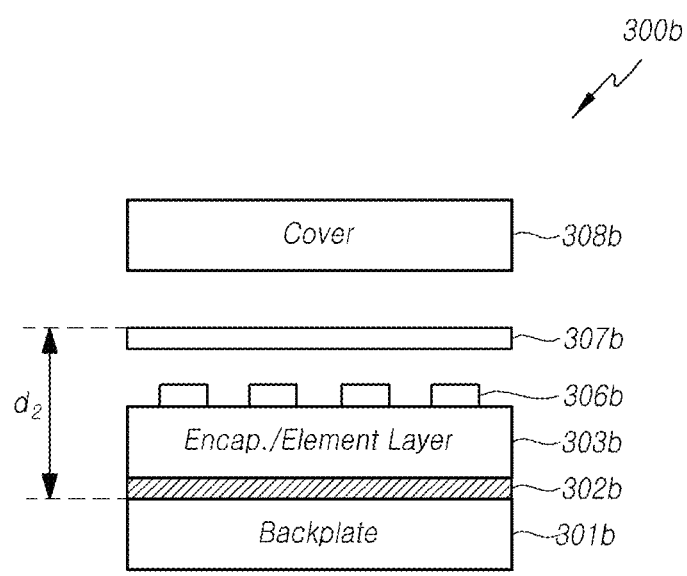
FIG. 3B is a cross-sectional diagram illustrating a second embodiment of the display device according to the embodiments of the present invention.

FIG. 3A is a cross-sectional diagram illustrating a first embodiment of the display device according to embodiments of the present invention, and FIG. 3B is a cross-sectional diagram illustrating a second embodiment of the display device according to the embodiments of the present invention.

With reference to FIG. 3A, the encapsulation/element layer 303*a* including an element layer and an encapsulation for protecting element layer may be disposed on the substrate 302*a* of the display device 300*a*. The element layer may include the thin film transistor (TFT) included in the pixel, a capacitor and a light emitting element. The encapsulation may include an organic film and/or an inorganic film, and may protect the light emitting element on the element layer. A film 305*a* may be disposed on the encapsulation/element layer 303*a*, and the touch electrode/touch line 306*a* may be disposed on the film 305*a*. The touch electrode may include the driving electrode and the sensing electrode. Furthermore, the film 305*a* may be fixed on the encapsulation/element layer 303*a* by an adhesive 304*a*. Here, the touch electrode/touch line 306*a* is illustrated as being formed on the same layer on the film 305*a*, but is not limited thereto.

The driving electrode and the sensing electrode among the touch electrode/touch line 306*a* may be disposed in different layers with an insulation film interposed therebetween. The driving electrodes and the sensing electrodes may be disposed on the same layer, but the driving electrodes or the sensing electrodes may be connected to each other through bridges, and the bridge may be disposed on a different layer from the driving electrode and the sensing electrode disposed on the same layer with the insulation film therebetween.

The cover glass 308*a* may be disposed on the film 305*a* on which the touch electrode/touch line 306*a* is disposed. The cover glass 308*a* may be fixed on the touch electrode/touch line 306*a* by an adhesive 307*a*. The back plate 301*a* may be disposed under the substrate 302*a*. Furthermore, the thin film transistor (TFT) is arranged on the substrate 302*a*, and the lines for transmitting signals may be formed in the substrate.

With reference to FIG. 3B, the encapsulation/element layer 303*b* including an element layer and an encapsulation for protecting element layer may be disposed on the substrate 302*b* of the display device 300*b*. The element layer may include the thin film transistor (TFT) included in the pixel, a capacitor and a light emitting element. The encapsulation may include an organic film and/or an inorganic film, and may protect the light emitting element on the element layer. The touch electrode/touch line 306*a* may be disposed on the encapsulation/element layer 303*b*. The touch electrode may include the driving electrode and the sensing electrode. Here, the touch electrode/touch line 306*a* is illustrated as being formed on the same layer on the encapsulation/element layer 303*b*, but is not limited thereto.

The driving electrode and the sensing electrode among the touch electrode/touch line 306a may be disposed in different layers with an insulation film interposed therebetween. The driving electrodes and the sensing electrodes may be disposed on the same layer, but the driving electrodes or the sensing electrodes may be connected to each other through bridges, and the bridge may be disposed on a different layer from the driving electrode and the sensing electrode. For example, the insulation film may be disposed under the driving electrode and the sensing electrode, and the bridge may be disposed under the insulation film. The bridge may connect the driving electrodes or the sensing electrodes through contact holes formed in the insulation film.

Here, the touch electrode/touch line 306b may be not directly disposed on the encapsulation of the encapsulation/element layer 303b. For example, the buffer layer is disposed on the encapsulation and the touch electrode/touch line 306a is disposed on the buffer layer, thereby it is possible to prevent damage to the encapsulation.

The cover glass 308b may be disposed on the encapsulation/element layer 303b on which the touch electrode/touch line 306b is disposed. The cover glass 308b may be fixed on the touch electrode/touch line 306b by an adhesive 307b. The back plate 301b may be disposed under the substrate 302b. Furthermore, the thin film transistor (TFT) is arranged on the substrate 302b, and the lines for transmitting signals may be formed in the substrate 302b.

Parasitic capacitance may be generated between the touch electrode/touch lines 306a and 306a and the TFTs and/or the lines included in the encapsulation/element layers 303a and 303b of FIGS. 3A and 3B. Accordingly, the voltage applied to the touch electrode may be affected by the signal transmitted to the TFT and/or the lines. As a result, the touch signal transmitted/received to/from the touch electrode may be distorted due to the signal transmitted to the TFT and/or the wires, and the touch may not be accurately detected.

In particular, in the case of the display device shown in FIG. 3B, the distance d2 from the touch electrode/touch lines 306b to the substrate 302b is smaller than the distance d1 from the touch electrode/touch lines 306a to the substrate 302a of the display device shown in FIG. 3A. Therefore, the capacitance of the capacitors formed between the touch electrodes/touch lines 306a and 306b and the TFTs and/or the lines may be larger in the display device 300b shown in FIG. 3B. Accordingly, in the case of the display device 300b shown in FIG. 3B, the distortion of the touch signal may be larger. Therefore, the distortion of the touch signal may be reduced by reducing the capacitance formed by the capacitors.

Figure 4:
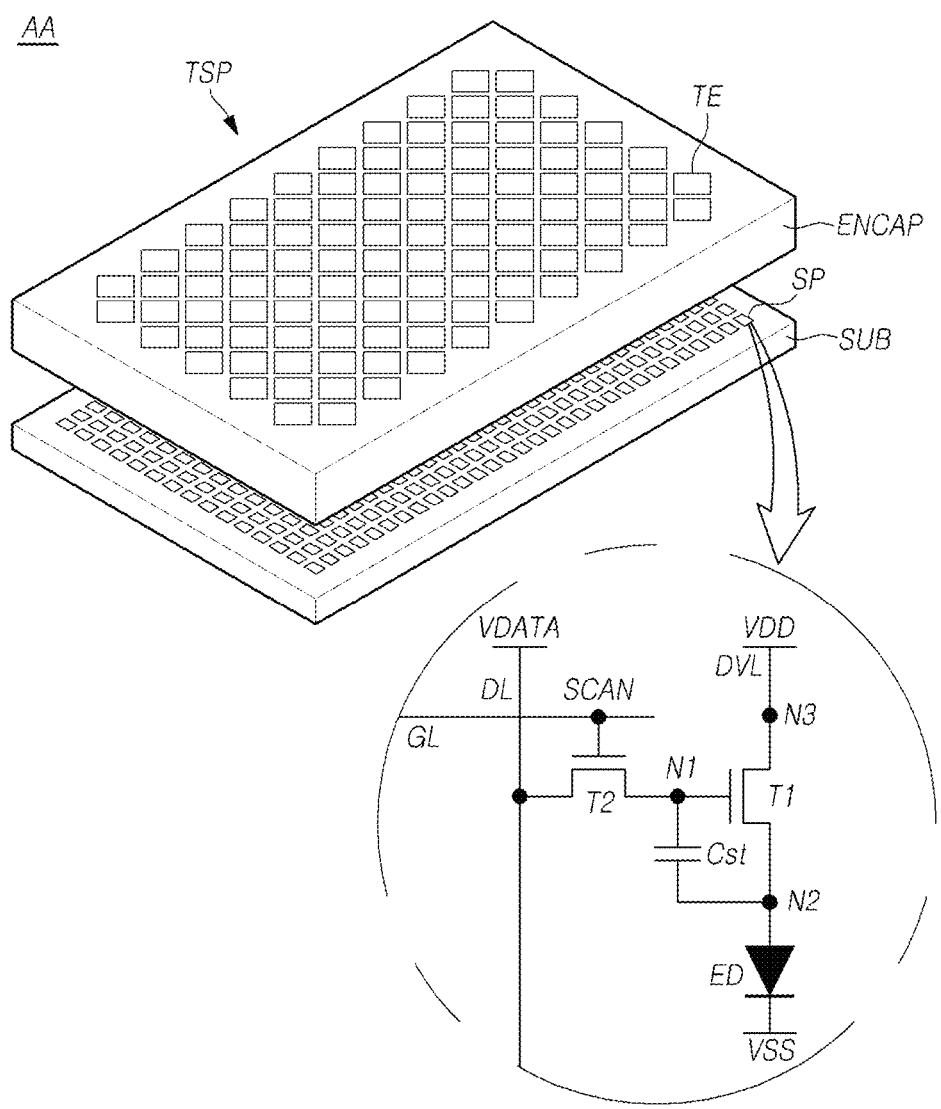
FIG. 4 is a perspective view illustrating an embodiment of a structure in which the touch panel (TSP) is embedded in a display panel (DISP) according to embodiments of the present invention.

FIG. 4 is a perspective view illustrating an embodiment of a structure in which the touch panel (TSP) is embedded in a display panel (DISP) according to embodiments of the present invention.

With reference to FIG. 4, in the active area (AA) of the display panel (DISP), the plurality of subpixels (SP) may be arranged on the substrate (SUB). Each subpixel (SP) may include the light emitting element (ED), the first transistor (T1) for driving the light emitting element (ED), the second transistor T2 for transmitting the data voltage (VDATA) to the first node (N1) of the first transistor (T1), and the storage capacitor (Cst) for maintaining a constant voltage for one frame.

The first transistor (T1) may include the first node (N1) to which the data voltage is applied, a second node (N2) to be electrically connected to the light emitting element (ED), and a third node (N3) to which the driving voltage (VDD) from a driving voltage line (DVL) is applied. The first node (N1) may be a gate node, the second node (N2) may be a source node or a drain node, and the third node (N3) may be a drain node or a source node. The first transistor (T1) may be also referred to as a driving transistor for driving the light emitting element (ED).

The light emitting element (ED) may include a first electrode (e.g., an anode electrode), a light emitting layer and a second electrode (e.g., a cathode electrode). The first electrode may be electrically connected to the second node (N2) of the first transistor (T1) and a base voltage (VSS) may be applied to the second electrode. The light emitting layer in the light emitting element (ED) may include a plurality of layers. The light emitting layer may be an organic light emitting layer containing an organic material. In this case, the light emitting element (ED) may be an organic light emitting diode (OLED).

The second transistor (T2) may be turned on and off by a scan signal (SCAN) applied through the gate line (GL) and may be electrically connected between the first node (N1) of the first transistor (T1) and the data line (DL). The second transistor (T2) may be also referred to as a switching transistor. The second transistor T2 is turned on by the scan signal (SCAN) and transfers the data voltage (VDATA) supplied from the data line (DL) to the first node (N1) of the first transistor (T1). The storage capacitor (Cst) may be electrically connected between the first node (N1) and the second node (N2) of the first transistor (T1).

Each subpixel (SP) may have a 2T1C structure including two transistors (T1, T2) and one capacitor (Cst) as shown in FIG. 3, and in some cases, may further include one or more transistors or one or more capacitors. The storage capacitor (Cst) may not be a parasitic capacitor (e.g., Cgs, Cgd) which is an internal capacitor existing between the first node (N1) and the second node (N2) of the first transistor (T1) but may be an external capacitor intentionally designed outside the first transistor (T1). Each of the first transistor (T1) and the second transistor (T2) may be an n-type transistor or a p-type transistor.

As described above, the circuit elements such as the light emitting element (ED), two or more transistors (T1, T2) and one or more capacitors (Cst) may be arranged in the display panel (DISP). Such a circuit element (in particular, the light emitting element ED) may be vulnerable to external moisture or oxygen, and therefore, an encapsulation layer (ENCAP) for preventing external moisture or oxygen from introducing into the circuit element (for example, the light emitting element ED) may be disposed on the display panel (DISP).

The encapsulation layer (ENCAP) may be a single layer or may be a plurality of layers. For example, in the case that the encapsulation layer (ENCAP) comprises a plurality of layers, the encapsulation layer (ENCAP) may include one or more inorganic encapsulation layers and one or more organic encapsulation layers. As a specific example, the encapsulation layer (ENCAP) may comprise a first inorganic encapsulation layer, an organic encapsulation layer and a second inorganic encapsulation layer. Here, the organic encapsulation layer may be located between the first inorganic encapsulation layer and the second inorganic encapsulation layer.

The first inorganic encapsulation layer may be formed on the second electrode (e.g., the cathode electrode) to be close to the light emitting element (ED). The first inorganic encapsulation layer may be formed of an inorganic insulating material capable of low temperature deposition such as silicon nitride ($SiN_x$), silicon oxide ($SiO_x$), silicon oxynitride (SiON), or aluminum oxide ($Al_2O_3$). Accordingly, because the first inorganic encapsulation layer is deposited in a low-temperature atmosphere, damage to the light emitting layer (organic light emitting layer) vulnerable to a high-temperature can be prevented during the deposition of the first inorganic encapsulation layer.

The organic encapsulation layer may have a smaller area than the first inorganic encapsulation layer and may be formed to expose both ends of the first inorganic encapsulation layer. The organic encapsulation layer may function as a buffer for relieving the stress between the respective layers due to the bending of the touch display device, and can enhance the planarization performance. The organic encapsulation layer may be formed of, for example, an organic insulating material such as acrylic resin, epoxy resin, polyimide, polyethylene or silicon oxycarbide (SiOC).

The second inorganic encapsulation layer may be formed on the organic encapsulation layer to cover the upper surface and the side surfaces of the organic encapsulation layer and the first inorganic encapsulation layer, respectively. Accordingly, the second inorganic encapsulation layer can minimize or prevent external moisture or oxygen from penetrating into the first inorganic encapsulation layer and the organic encapsulation layer. The second inorganic encapsulation layer may be formed of, for example, an inorganic insulating material such as silicon nitride (SiNx), silicon oxide (SiOx), silicon oxynitride (SiON), or aluminum oxide (Al2O3).

In the touch display device according to the embodiments of the present invention, the touch panel (TSP) may be formed on the encapsulation layer (ENCAP). For example, in the touch display device, the touch sensor structure such as the plurality of touch electrodes (TE) forming the touch panel (TSP) may be disposed on the encapsulation layer (ENCAP).

In the touch sensing, the driving signal or the sensing signal may be applied to the touch electrode (TE). Therefore, in the touch sensing, a potential difference may be formed between the touch electrode (TE) and the cathode electrode disposed with the encapsulation layer (ENCAP) therebetween, and unnecessary parasitic capacitance may be generated. Because this parasitic capacitance may lower the touch sensitivity, the distance between the touch electrode (TE) and the cathode electrode may be set to a predetermined value (for example, 5 μm) or more. For this, for example, the thickness of the encapsulation layer (ENCAP) may be designed to be at least 5 μm or more.

Figure 5:
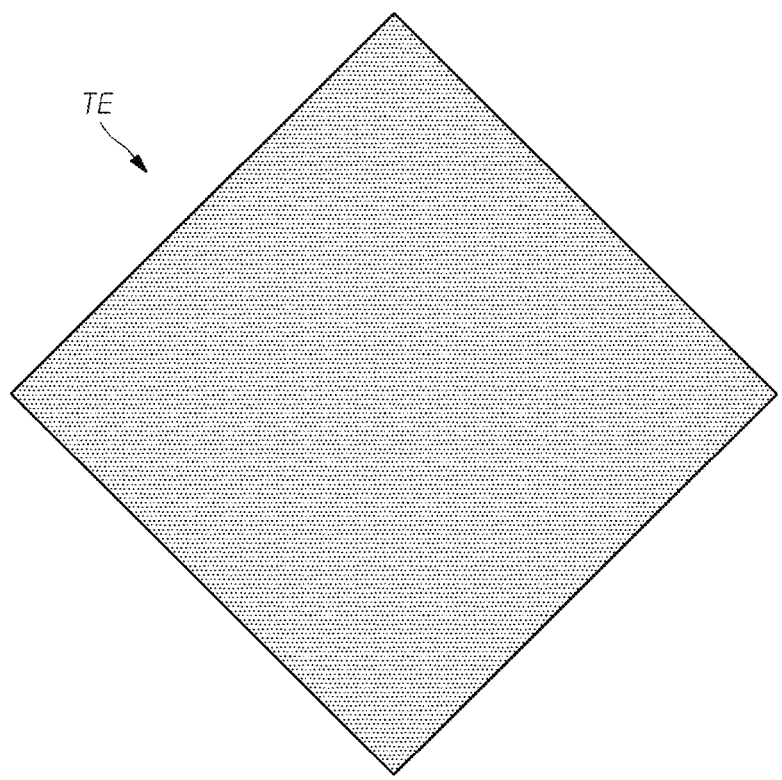
FIG. 5 is a plan view illustrating the first embodiment of types of touch electrodes (TE) disposed on the display panel (DISP) according to embodiments of the present invention.
Figure 6:
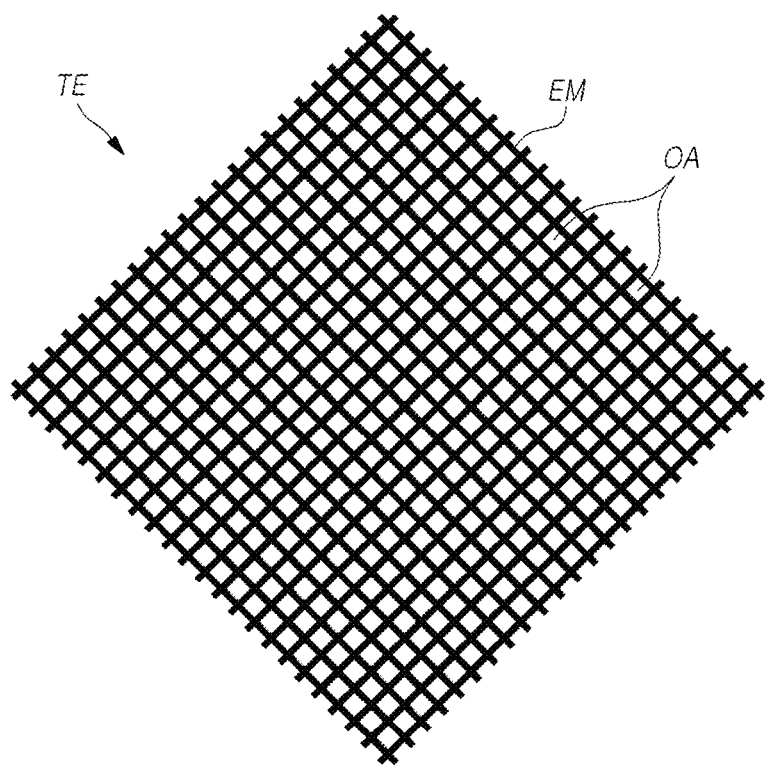
FIG. 6 is a plan view illustrating the second embodiment of types of touch electrodes (TE) disposed on the display panel (DISP) according to embodiments of the present invention.
Figure 7:
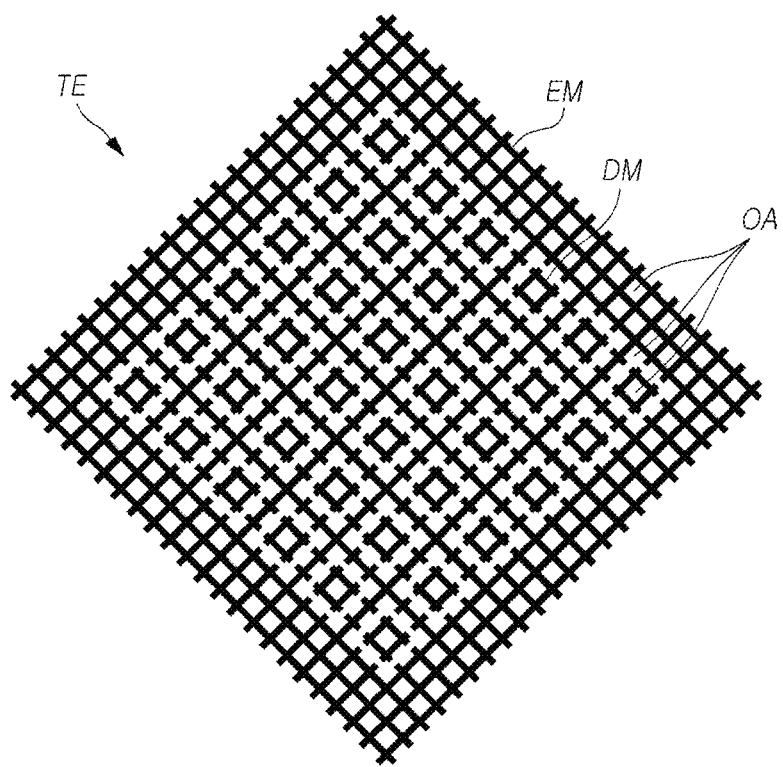
FIG. 7 is a plan view illustrating the third embodiment of types of touch electrodes (TE) disposed on the display panel (DISP) according to embodiments of the present invention.

FIG. 5 is a plan view illustrating the first embodiment of types of touch electrodes (TE) disposed on the display panel (DISP) according to embodiments of the present invention, and FIG. 6 is a plan view illustrating the second embodiment of types of touch electrodes (TE) disposed on the display panel (DISP) according to embodiments of the present invention, and FIG. 7 is a plan view illustrating the third embodiment of types of touch electrodes (TE) disposed on the display panel (DISP) according to embodiments of the present invention.

As illustrated in FIG. 5, each of the touch electrodes (TE) disposed on the display panel (DISP) may be a plate shaped electrode metal having no openings. In this case, each touch electrode (TE) may be a transparent electrode. For example, each touch electrode (TE) may be fomed of the transparent electrode material so that light emitted from the plurality of subpixels (SP) arranged below may be transmitted upward.

Alternatively, as shown in FIG. 6, each of the touch electrodes (TE) disposed on the display panel (DISP) may be patterned into a mesh type to form electrode metal (EM) having two or more openings (OA). The electrode metal (EM) corresponds to a substantial touch electrode (TE) and is a portion where the touch driving signal is applied or the touch sensing signal is detected.

As illustrated in FIG. 6, in the case that each touch electrode (TE) is the electrode metal (EM) patterned with a mesh type, two or more openings (OA) may exist in a region of the touch electrode (TE). Each of the at least two openings (OA) in each touch electrode (TE) may correspond to a light emitting region of one or more subpixels (SP). For example, the plurality of openings (OA) may be paths through which the light emitted from the plurality of subpixels (SP) arranged below passes. Hereinafter, for convenience of explanation, it is assumed that each touch electrode (TE) is the mesh-type electrode metal (EM).

The electrode metal (EM) corresponding to each touch electrode (TE) may be located on a bank which is disposed in an area other than the light emitting area of two or more sub pixels (SP). As a method of forming the plurality of touch electrodes (TE), after the electrode metal (EM) is formed in a wide mesh shape, the electrode metal (EM) may be cut into a predetermined pattern to electrically separate the electrode metal (EM) to thereby form the plurality of touch electrodes (TE).

As shown in FIGS. 5 and 6, the outline shape of the touch electrode (TE) may be a square shape such as a diamond shape, a rhombus shape, or another shapes such as a triangle shape, a pentagon shape or a hexagon shape.

With reference to FIG. 7, in the area of each touch electrode (TE), there may be the mesh type electrode metal (EM) and at least one dummy metal (DM) separate from the mesh type electrode metal (EM).

The electrode metal (EM) is a portion corresponding to a substantial touch electrode (TE) and is the portion in which the touch driving signal is applied or the touch sensing signal is detected. Meanwhile, though the dummy metal (DM) may exist in the area of the touch electrode (TE), however the touch driving signal is not applied to the dummy metal (DM) and the touch sensing signal is not detected at the dummy metal (DM). For example, the dummy metal (DM) may be an electrically floated metal portion.

Accordingly, the electrode metal (EM) can be electrically connected to the touch driving circuit (TDC), but the dummy metal (DM) is not electrically connected to the touch driving circuit (TDC).

At least one dummy metal (DM) may exist in a state of being disconnected from the electrode metal (EM) in each region of each of the touch electrodes (TE). Alternatively, at least one dummy metal (DM) may exist in the state of being disconnected from the electrode metal (EM) only in a region of each of some touch electrode among all the touch electrodes (TE). For example, the dummy metal (DM) may not exist in the area of some of the touch electrodes (TE).

As shown in FIG. 6, with regard to the role of dummy metal (DM), in the case that there is no dummy metal DM in the area of the touch electrode (TE) and only the electrode metal (EM) is formed as the mesh type, a visibility problem in which the contour of the electrode metal (EM) is visible on the display surface may occur.

In contrast, as shown in FIG. 7, in the case that one or more dummy metals (DM) are present in the area of the touch electrode (TE), the visibility problem of the outline of the electrode metal (EM) on the display surface may be prevented. Furthermore, the capacitance of each touch electrode (TE) may be adjusted to improve the touch sensitivity by adjusting the presence or number (dummy metal ratio) of the dummy metal (DM) for each touch electrode (TE).

Meanwhile, the cut electrode metal (EM) may be formed of the dummy metal (DM) by cutting some points on the electrode metal (EM) formed in the area of one touch electrode (TE). For example, the electrode metal (EM) and the dummy metal (DM) may be the same material formed in the same layer.

The touch display device according to the embodiments of the present invention may sense a touch based on the capacitance formed on the touch electrode (TE). The touch display device according to embodiments of the present invention may utilize the capacitance-based touch sensing method, which can sense a touch by a mutual-capacitance-based touch sensing method or a self-capacitance-based touch sensing method.

In the case of a mutual-capacitance-based touch sensing method, a plurality of touch electrodes (TE) may be classified into the driving touch electrode (transmission touch electrode) for applying the touch driving signal, and the sensing touch electrode (receiving touch electrode) which is used for detecting the touch sensing signal and forms capacitance with the driving touch electrode.

In the case of the mutual-capacitance-based touch sensing method, the touch sensing circuit (TSC) may detects presence/absence of touch and/or touch coordinates based on a change in capacitance (mutual-capacitance) between the driving touch electrode and the sensing touch electrode generated in accordance with the presence or absence of a pointer such as the finger, pen and the like.

In the case of a self-capacitance-based touch sensing method, each touch electrode (TE) may serve as both the driving touch electrode and the sensing touch electrode. For example, the touch sensing circuit (TSC) applies the touch driving signal to one or more touch electrodes (TE) and detects the touch sensing signal through the touch electrode (TE) to which the touch driving signal is applied. Then, the touch sensing circuit (TSC) may detect the presence or absence of a touch and/or the touch coordinates by using the change in capacitance between the touch electrode (TE) and the pointer such as the finger and the pen and based on the sensed touch sensing signal. In the self-capacitance-based touch sensing method, there is no distinction between the driving touch electrode and the sensing touch electrode.

As described above, the touch display device according to the embodiments of the present invention can sense the touch by the mutual-capacitance-based touch sensing method or the self-capacitance based touch sensing method. Hereinafter, for convenience of explanation, there is described as an example, the touch display device performing the mutual-capacitance-based touch sensing and having the touch sensor structure for this purpose.

Figure 8:
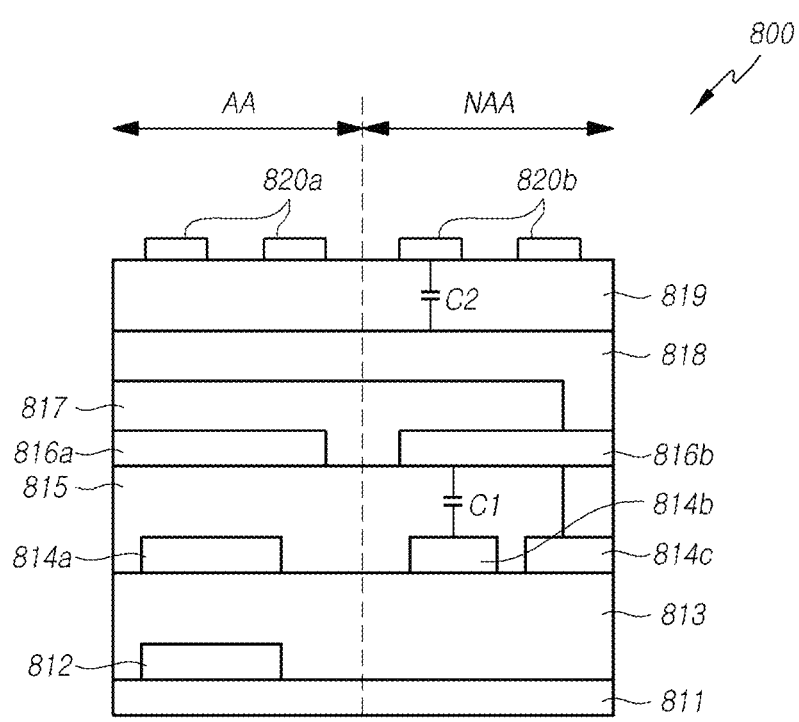
FIG. 8 is a cross-sectional view illustrating the first embodiment of a section taken along line A-A' in the display panel shown in FIG. 2.

FIG. 8 is a cross-sectional view illustrating the first embodiment of a section for the display panel shown in FIG. 2.

With reference to FIG. 8, a gate metal is deposited on the substrate 811 of the display panel 800 and patterned to form the gate electrode 812 in the active area (AA) on the substrate 811. The gate electrode 812 may correspond to the gate line and the gate electrode of the transistors of the pixel shown in FIG. 3. A gate insulation film 813 may be deposited on the substrate 811 on which the gate electrode 812 is formed. The gate insulation film 813 may be deposited on the active area (AA) and the non-active area (NAA) of the substrate 811.

The source drain metal may be deposited on the gate insulation film 813. The source/drain electrode 814a, the driving line 814b, and the power line 814c may be formed by patterning the deposited the source drain metal. The source/drain electrode 814a may be disposed on the active area (AA) and the driving line 814b and the power line 814c may be disposed on the non-active area (NAA) on the substrate 811. The source/drain electrode 814a may include the data line (DL) connected to the pixel and the source/drain electrode in the pixel shown in FIG. 4, and a high voltage line (VL). In addition, the driving line 814b may transfer a clock transmitted to the GIP circuit of FIG. 2. However, the present embodiment is not limited thereto. The power line 814c may transfer the voltage to the cathode electrode of the organic light emitting diode (OLED) shown in FIG. 4, but is not limited thereto.

The first insulation film 815 may be deposited on the gate insulation film 813 on which the source drain metal is patterned. The first insulation film 815 may be disposed in the active area (AA) and the non-active area (NAA). The conductive layer may be deposited on the first insulation film 815 and may be patterned to form the anode electrode 816a.

The power line 816b may be formed during the anode electrode 816a is formed. The anode electrode 816a may be formed in the active area (AA) and the power line 816b may be formed in the non-active area (NAA). The anode electrode 816a may correspond to the anode electrode 816a of the light emitting element (ED) shown in FIG. 4.

The first insulation film 815 may have a contact hole and the power line 816b on the first insulation film 815 may be connected to the power line 814c on the gate insulation film 813 through the contact hole. As a result, the area of the power lines 814c and 816b can be increased to reduce the resistance of the power line.

The light emitting layer 817 may be formed on the anode electrode 816a. Here, the light emitting layer 817 may be formed in both the active area (AA) and the non-active area (NAA). Furthermore, the light emitting layer 817 may be formed only in a certain region on the anode electrode 816a. However, the present embodiment is not limited thereto, and may include pixel defining layers (not shown) and an organic light emitting layer disposed between the pixel defining layers. The light emitting layer 817 may include an organic light emitting layer. The light emitting layer 817 may be a plurality of layers.

The cathode electrode 818 may be formed on the light emitting layer 817. The cathode electrode 818 may be commonly applied to a plurality of pixels. The cathode electrode 818 may be connected to the power line 816b disposed on the first insulation film 815. The second insulation film 819 may be disposed on the cathode electrode 818 and the touch electrode 820a and the touch line 820b may be disposed on the second insulation film 819.

The touch electrode 820a may be disposed in the active area (AA) and the touch line 820b may be disposed in the non-active area (NAA). Furthermore, the second insulation film 819 may be the encapsulation of the encapsulation/element layer 303a of FIGS. 3A and 3B. Accordingly, the touch electrode 820a and the touch line 820b may be disposed on the encapsulation. In addition, the touch line 820b may be connected to the touch electrode 820a. The touch line 820b transmits/receives the touch signal to/from the touch IC 130b shown in FIG. 1 to detect the touch on the touch electrode 820a.

In the display device as described above, the first capacitor (C1) may be formed by the driving line 814b disposed on the gate insulation film 813 and the power line 816b disposed on the first insulation film 815. In addition, the second capacitor (C2) may be formed by the touch line 820*b* disposed on the second insulation film 819 and the cathode electrode 818.

Accordingly, because the display panel 800 may include the first capacitor (C1) and the second capacitor (C2), when the clock is transmitted through the driving line 814*b*, the clock may be transferred to the touch line 820*b* through the first capacitor (C1) and the second capacitor (C2). The touch line 820*b* may recognize the clock as noise, which may cause a problem that the touch cannot be accurately detected by the clock.

Here, the driving line 814*b* is illustrated as disposed on the gate insulation film 813, but is not limited thereto, and the driving line 814*b* may be formed at the same time when the gate electrode 812 is formed and to be disposed on the substrate 811. In this case, the capacitance of the second capacitor (C2) may be smaller than that in the case in which the drive line 814*b* is disposed on the gate insulation film 813. In addition, the power lines 814*c* and 816*b* are disposed on the gate insulation film 813 and the first insulation film 815 and are connected to each other, so that the area of the power lines may be larger than that in the case in which the power line 816*b* disposed only on the first insulation film 815. As a result, a uniform voltage may be applied to the pixels, thereby it is possible to improve the image quality.

Figure 9A:
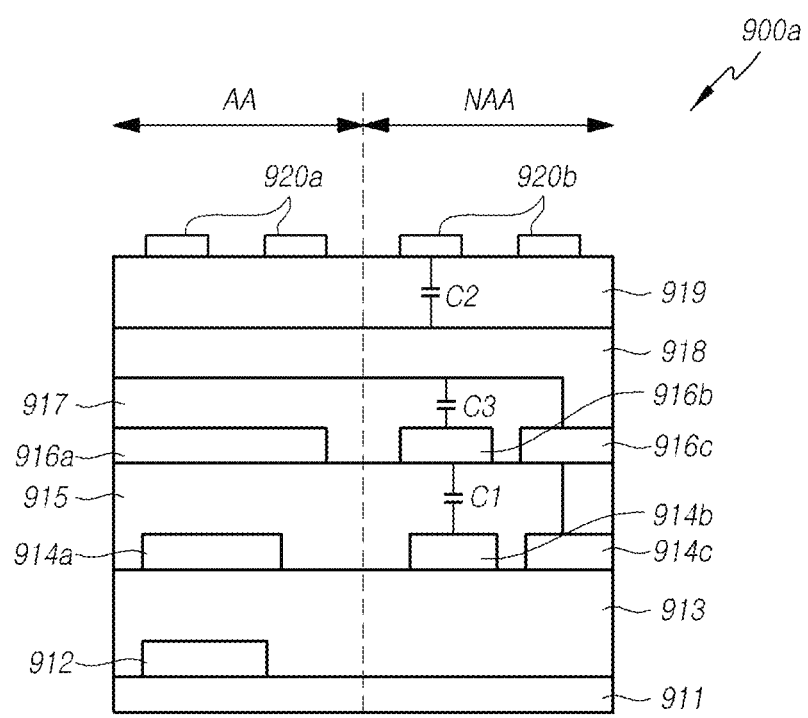
FIG. 9A is a cross-sectional view illustrating the second embodiment of a section taken along line A-A' in the display panel shown in FIG. 2.
Figure 9B:
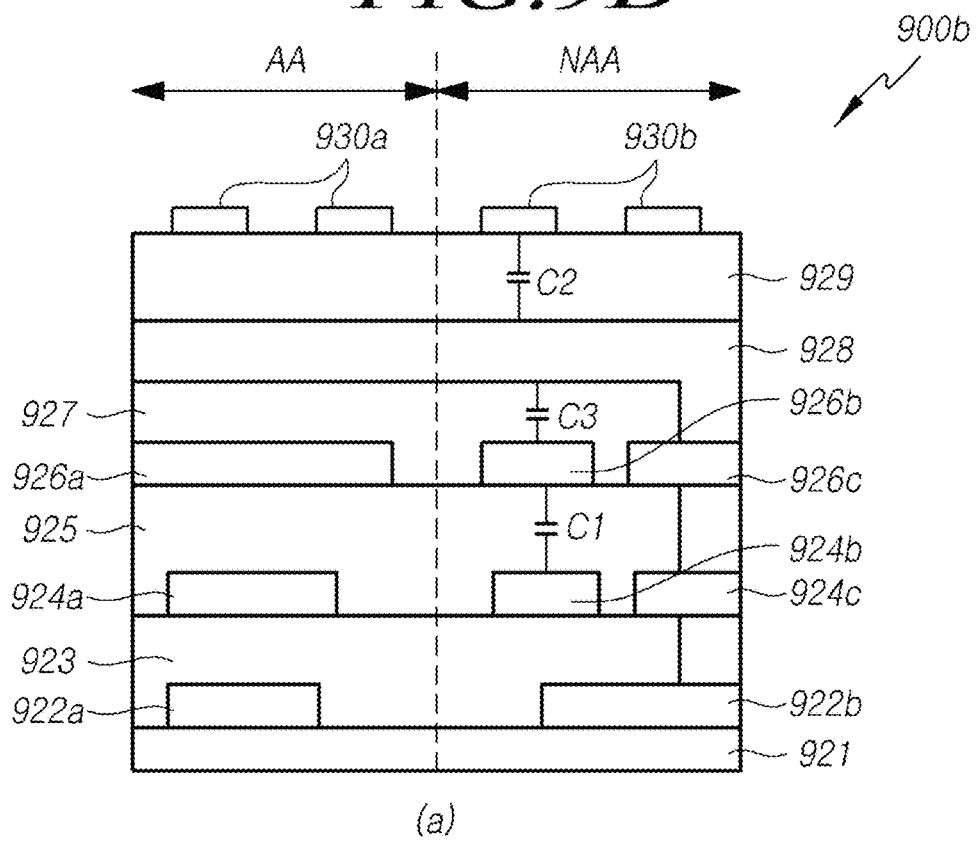
FIG. 9B is a cross-sectional view illustrating the third embodiment of a section taken along line A-A' in the display panel shown in FIG. 2.
Figure 9B:
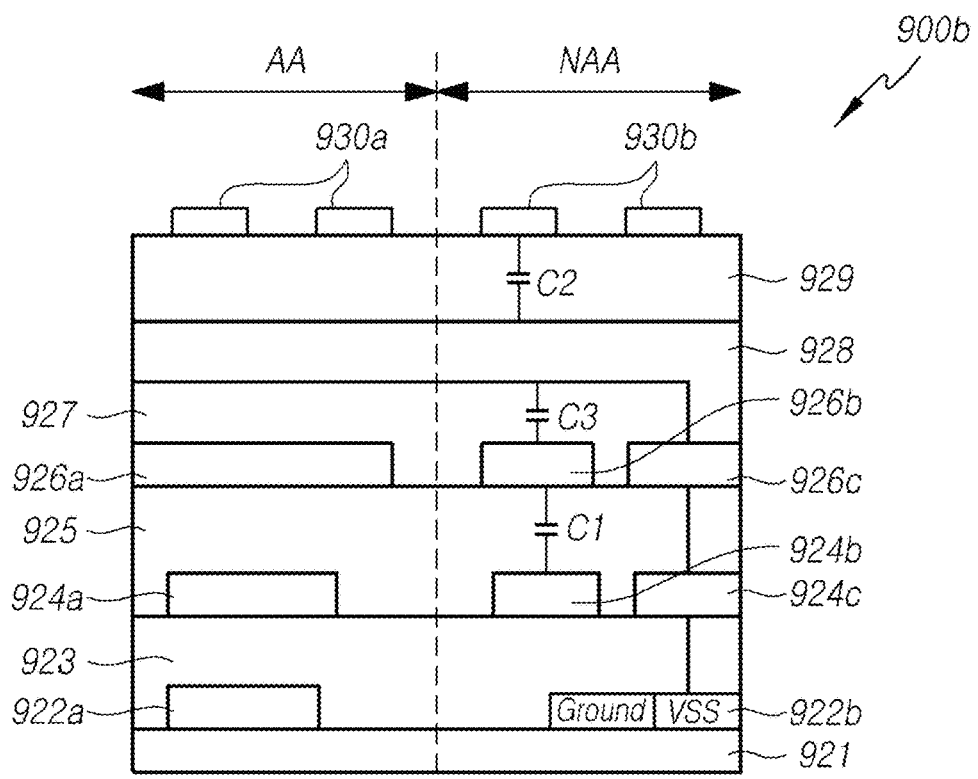
Figure 9C:
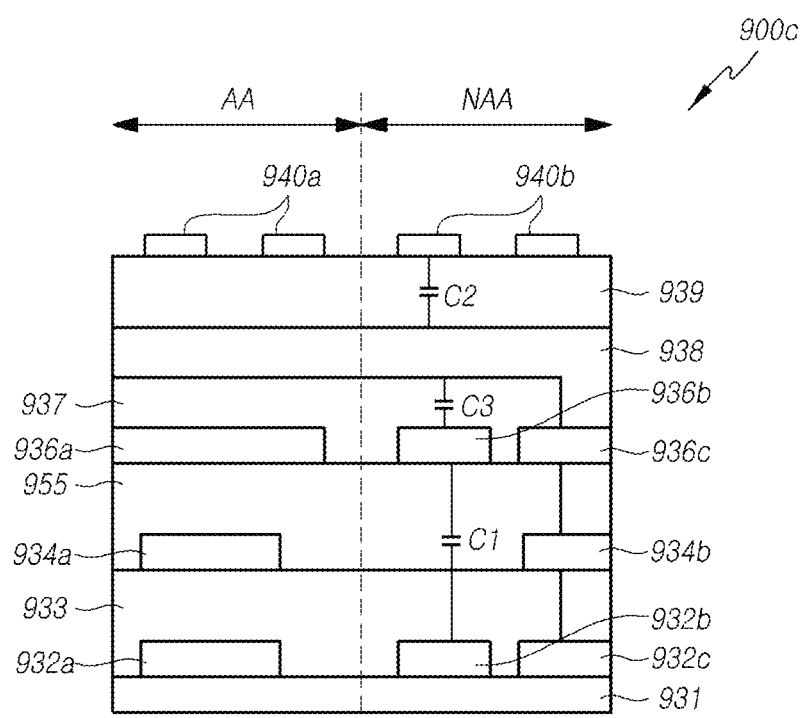
FIG. 9C is a cross-sectional view illustrating the fourth embodiment of a section taken along line A-A' in the display panel shown in FIG. 2.

FIG. 9A is a cross-sectional view illustrating the second embodiment of a section taken along line A-A' in the display panel shown in FIG. 2, and FIG. 9B is a cross-sectional view illustrating the third embodiment of a section taken along line A-A' in the display panel shown in FIG. 2, and FIG. 9C is a cross-sectional view illustrating the fourth embodiment of a section taken along line A-A' in the display panel shown in FIG. 2.

The display panels 900*a*, 900*b*, and 900*c* may include the substrates 911, 921 and 931 including the active area (AA) in which a plurality of pixels are arranged and a non-active area in which driving line 914*b*, 924*b* and 932*b* for transferring the display driving signals for driving pixels are disposed; the touch electrodes 920*a*, 930*a* and 940*a* disposed on the substrates 911, 921 and 931 corresponding to the active area (AA); the touch lines 920*b*, 930*b*, and 940*b* disposed on the substrates 911, 921, and 931 in correspondence with the non-active area (NAA) for supplying touch signals to the touch electrodes 920*a*, 930*a*, and 940*a*; the driving lines 914*b*, 924*b*, and 932*b* disposed below the touch lines 920*b*, 930*b*, and 940*b* in the non-active area (NAA) for transmitting the clock signal to the active area (AA); and the shield layers 916*b*, 926*b*, and 936*b* disposed between the driving lines 914*b*, 924*b*, and 932*b* and the touch lines 920*b*, 930*b*, and 940*b*.

Here, the driving line 914*b*, 924*b*, and 932*b* may transfer clock signals. However, the present embodiment is not limited thereto, and signals and/or voltages for displaying an image in the active area (AA) may be transferred.

The shield layers 916*b*, 926*b* and 936*b* are disposed between the touch lines 920*b*, 930*b* and 940*b* and the driving lines 914*b* and 924*b* and 932*b* so that the third capacitors (C3) may be disposed in the display panel 900*a* and 900*b* and 900*c*. The first capacitor (C1) may be formed between the shield layers 916*b*, 926*b* and 936*b* and the driving line 914*b*, 924*b* and 932*b* and the second capacitor (C2) may be formed between the touch lines 920*b*, 930*b* and 940*b* and the cathode electrodes 918, 928 and 938, and the third capacitor (C3) may be formed between the shield layers 916*b*, 926*b*, and 936*b* and the cathode electrodes 918, 928 and 938. For example, the shield layers 916*b*, 926*b* and 936*b* may be disposed apart from the cathode electrodes 918, 928, and 938. Accordingly, the first capacitor (C1), the second capacitor (C2) and the third capacitor (C3) may be connected in series.

The shielding layers 916*b*, 926*b* and 936*b* are formed between the touch lines 920*b*, 930*b* and 940*b* and the driving lines 914*b*, 924*b* and 932*b* in a state in which the distances between the touch lines 920*b*, 930*b* and 940*b* and the driving lines 914*b*, 924*b* and 932*b* are constant. Accordingly, the third capacitor (C3) may be connected in series to the first capacitor (C1) and the second capacitor (C2) unlike the display device shown in FIG. 8.

In the case that the first capacitor (C1), the second capacitor (C2) and the third capacitor C3 are connected in series, the capacitance value formed by the first capacitor (C1), the second capacitor (C2) and the third capacitor (C3) may be smaller than that when only the first capacitor (C1) and the second capacitor (C2) are connected in series, as shown in FIG. 8. Therefore, the capacitance value between the touch lines 920*b*, 930*b*, and 940*b* and other lines can be smaller than that of the display device shown in FIG. 8. Accordingly, it is possible to reduce the signal and/or the voltage such as the clock transmitted to the driving lines 914*b*, 924*b*, and 932*b* from being transmitted to the touch lines 920*b*, 930*b*, and 940*b*, thereby it is possible to improve the accuracy of touch.

The shield layers 916*b*, 926*b*, and 936*b* may be in a floating state. Alternatively, a predetermined voltage may be applied to the shield layers 916*b*, 926*b*, and 936*b*. The predetermined voltage may be the ground voltage, but is not limited thereto. When the predetermined voltage is applied to the shield layers 916*b*, 926*b* and 936*b*, because the voltage applied to the shield layer 916*b*, 926*b* and 936*b* may become constant, the influence of the noise can be further reduced as compared with the case where the shield layer 916*b*, 926*b* and 936*b* are floated. In the case that the ground voltage is applied to the shield layers 916*b*, 926*b*, and 936*b*, the shield layers 916*b*, 926*b*, and 936*b* may be referred to as ground electrodes.

With reference to FIG. 9A, the gate metal is deposited and patterned on a substrate 911 of a display panel 900*a* and the gate electrode 912 may be formed on an active area AA on the substrate 911.

The gate electrode 912 may correspond to the gate electrode and the gate line of the transistors of the pixel shown in FIG. 4. However, the present invention is not limited thereto. The gate insulation film 913 may be deposited on the substrate 911 on which the gate electrode 912 is formed. The gate insulation film 913 may be deposited on the active area (AA) and the non-active area (NAA) of the substrate 911.

The source/drain metal may be deposited on the gate insulation film 913. Then, the source/drain electrodes 914*a*, the driving line 914*b* and the power line 914*c* may be formed by patterning the deposited source/drain metal. The source/drain electrode 914*a* may be disposed on the active area (AA) and the driving line 914*b* and the power line 914*c* may be disposed on the non-active area (NAA) on the substrate 911. The driving line 914*b* and the power line 914*c* may correspond to the data line (DL) and the high voltage line (VL) connected to the pixel shown in FIG. 4, but are not limited thereto.

Furthermore, the driving line 914*b* may transmit the clock applied to the GIP circuit of FIG. 2. The power line 914*c* may transmit the voltage applied to the cathode electrode of the organic light emitting diode OLED shown in FIG. 3, but is not limited thereto.

The first insulation film 915 may be deposited on the gate insulation film 913 on which the source/drain metal is patterned. The first insulation film 915 may be disposed in the active area (AA) and the non-active area (NAA). Then, the conductive layer is deposited on the first insulation film 915 and patterned to form the anode electrode 916a.

The shield layer 916b and the power line 916c may be formed at the time when the anode electrode 916a is formed. Therefore, the shield layer 916b and the power line 916c may be formed of the same material as the anode electrode 916a, but is not limited thereto.

The anode electrode 916a may be formed in the active are (AA) and the shield layer 916b and the power line 916c may be formed in the non-active area (NAA). The anode electrode 916a may correspond to the anode electrode of the organic light emitting diode shown in FIG. 4. The power line 916c disposed on the first insulating film 915 may be referred to as a first power line and the power line 914c disposed on the gate insulating film 913 may be referred to as a second power line.

The contact hole is formed in the first insulation layer 915 and the power line 916c on the first insulation layer 915 may be connected to the power line 914c on the gate insulation layer 916 through the contact hole. As a result, the areas of the power lines 914c and 916c can be increased. The power line 916c disposed on the first insulation film 915 may be also referred to as a first power line and the power line 914c disposed on the gate insulation film 913 may be also referred to as a second power line.

The light emitting layer 917 may be formed on the anode electrode 916a. Here, the light emitting layer 917 may be formed in the active area (AA) and the non-active area (NAA).

In addition, the light emitting layer 917 may be formed only in a certain region on the anode electrode 916a. The light emitting layer 917 may include an organic light emitting layer. However, the present invention is not limited thereto, and the light emitting layer 917 may include an organic light emitting layer disposed between the pixel defining layer (not shown) and the pixel defining layer. Furthermore, the light emitting layer 917 may be a plurality of layers.

The cathode electrode 918 may be formed on the light emitting layer 917. The cathode electrode 918 may be commonly applied to a plurality of pixels. The cathode electrode 918 may be connected to the power line 916c disposed on the first insulation layer 915. The second insulation film 919 may be disposed on the cathode electrode 918 and the touch electrode 920a and the touch line 920b may be disposed on the second insulation film 919. The touch electrode 920a may be disposed in the active area (AA) and the touch line 920b may be disposed in the non-active area (NAA).

The second insulation film 919 may be the encapsulation of the encapsulation/element layer 303a of FIGS. 3A and 3B. Accordingly, the touch electrode 920a and the touch line 920b may be disposed on the encapsulation. In addition, the touch line 920b may be connected to the touch electrode 920a. The touch line 920b may transmit/receive the touch signal to/from the touch IC 130b shown in FIG. 1 to detect the touch on the touch electrode 920a.

In the display device 900a implemented as described above, the first capacitor (C1) may be formed by the drive line 914b disposed on the gate insulation film 913 and the shield layer 916b disposed on the first insulation film 915. The second capacitor (C2) may be formed by the touch line 920b disposed on the second insulation film 919 and the cathode electrode 918. The third capacitor (C3) may be formed by the shield layer 916b and the cathode electrode 918.

With reference to FIGS. 9B (a) and (b), a gate electrode 922a may be formed on the active area AA on the substrate 921, and the power line 922b may be disposed on the substrate 921. In this case, the power line 922b disposed on the substrate 921 may be connected to the power line 924c disposed on the gate insulation film 923. Source/drain electrodes 924a may be disposed on the gate insulation film 923.

Thus, the area of the power lines 922b, 924c, and 926c connected to the cathode electrode 928 can be larger than that in the case shown in FIG. 9A. In this case, as illustrated in FIG. 9B (b), the power line 922b disposed on the substrate 921 may be divided into two (e.g., two electrodes spaced apart from each other), and only one of the two may be connected to the power line 924c disposed on the gate insulation film 923. The remaining one of the power lines 922b disposed on the substrate 921 may be grounded. The power line which is grounded among the power lines 922b may be referred to as the ground electrode. The power line 926c disposed on the first insulation film 925 may be referred to as the first power line, and the power line 924c disposed on the gate insulation film 923 may be referred to as the second power line. The power line 922b disposed on the substrate 921 may be referred to as a third power line. An anode electrode 926a may be disposed on the first insulation film 925, and a light emitting layer 927 may be formed on the anode electrode 926a. Further, a second insulation film 929 may be disposed on the cathode electrode 928.

In the display device 900c according to FIG. 9C, the driving line 932b may be disposed on the substrate 931 and may be formed when the gate electrode 932a is formed. For example, the driving line 932b may be formed of the gate metal. Source/drain electrodes 934a may be disposed on a gate insulation film 933.

The area of the power line 932c disposed on the substrate 931, the power line 934b disposed on the gate insulation film 933 and the power line 936c disposed on the first insulation film 955 may increase, and thus the resistances of the power lines 932c, 934b, and 936c can be lowered. As a result, the uniform voltage is transmitted to the pixels so as to improve the image quality. The power line 936c disposed on the first insulation film 955 may be referred to as the first power line, and the power line 934b disposed on the gate insulation film 923 may be referred to as the second power line. The power line 932c disposed on the substrate 921 may be referred to as the third power line. An anode electrode 936a may be disposed on the first insulation film 955.

Figure 10:
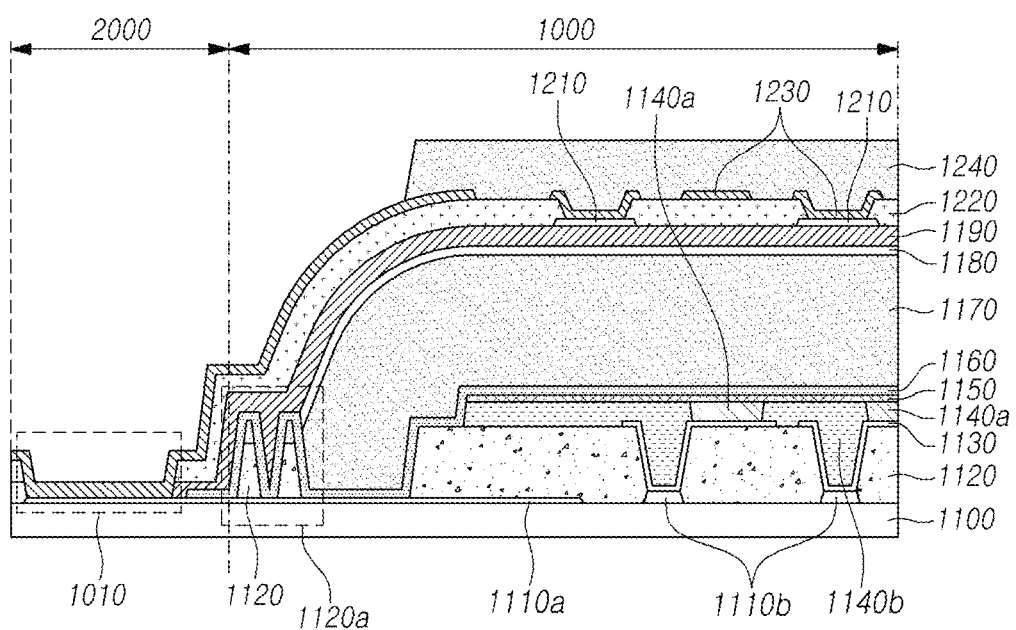
FIG. 10 is a cross-sectional view illustrating an embodiment of a cross section of the display apparatus according to embodiments of the present invention.

FIG. 10 is a cross-sectional view illustrating an embodiment of a cross section of the display apparatus according to embodiments of the present invention.

With reference to FIG. 10, the substrate 1100 may be divided into the active area 1000 and the pad area 2000. The thin film transistor, the gate line (not shown) for applying the gate signal to the thin film transistor, and the data line (not shown) for applying the data signal to the thin film transistor may be formed on the active area 1000.

The substrate 1100 may be formed of polyamide, but is not limited thereto. Furthermore, the source electrode (not shown) and a drain electrode 111b of the thin film transistor may be formed at the time when the data line is formed on the substrate 1100. The signal line 1110a extending from the pad area 2000 to the active area 1000 may be formed when forming the data line.

The signal line 1110a may be the pad 1010 exposed in the pad area 2000 and connected to an external device. However, the present invention is not limited thereto. The external device connected to the pad 1010 may be the data driver or the gate driver. The external device connected to the pad 1010 may be a printed circuit board (PCB) on which the data driver and the gate driver are mounted, but is not limited thereto.

A planarization film 1120 may be formed on the drain electrode 1110*b*. The planarization film 112 may be patterned and the anode electrode 1130 disposed on the planarization film 112 may be connected to the drain electrode 1110*b* disposed below the planarization film 112. The bank 1140*b* may be formed on the anode electrode 1130 and the organic light emitting layer 1140*a* may be formed on the cavity formed in the bank 1140*b*.

The cathode electrode 1150 may be formed on the bank 1140*b* on which the organic light emitting layer 1140*a* is formed. The bank 1140*b* in which the organic light emitting layer 1140*a* is formed in the cavity may be referred to as the light emitting layer. The cathode electrode 1150 may be the common electrode. The first inorganic film 1160 may be formed on the cathode electrode 1150.

The first inorganic film 1160 may be formed at a portion where the dam area where the dam 1120*a* is formed is adjacent to the pad area 2000 and the active area 1000. The dam 1120*a* may be formed when the planarization film 1120 is formed. Further, the dam 1120*a* may be a double structure.

When the first inorganic film 1160 is formed, the first inorganic film 1160 may be patterned using a mask. The first inorganic film 1160 may not cover the pad area 2000 by patterning. The first inorganic film 1160 may cover the upper portion of the dam 1120*a*. However, the present invention is not limited thereto. In addition, an area on the substrate 1100 with respect to the dam 1120*a* may be divided into the active area 1000 and the pad area 2000. However, the present invention is not limited thereto, and the pad area 2000 may be the region in which the signal line 1110*a* disposed on the substrate 1100 is exposed or the conductor disposed on the signal line 1110*a* is exposed. The conductor disposed on the signal line 1110*a* may be the second touch electrode 1230 described below.

The first organic film 1170 may be formed on the first inorganic film 1160. The first organic film 1170 may be disposed to be a thick layer on the organic light emitting film 1140*a* to protect the organic light emitting film 1140*a*, so that it is possible to prevent the external matter such as moisture from penetrating into the organic light emitting film 1140*a*.

The first inorganic film 1160 may have a certain limit to increase the thickness. Therefore, the organic light emitting film 1140*a* can be protected by increasing the thickness by disposing the first organic film 1170 on the first inorganic film 1160. It is possible to prevent the first organic film 1170 from penetrating into the pad area 2000 by the dam 1120*a*.

The second inorganic film 1180 may be formed on the first organic film 1170. The second inorganic film 1180 may cover the upper portion of the dam 1120*a* formed by the first inorganic film 1160 and the planarization film 1120. The stacked first inorganic film 1160, the first organic film 1170 and the second inorganic film 1180 can be referred to as the encapsulation layer.

A touch buffer layer 1190 may be formed on the second inorganic film 1180. The touch sensor unit may be mounted on the encapsulation layer by patterning the touch electrode on the encapsulation layer. Damage to the encapsulation layer may occur in the process of forming the touch electrode on the encapsulation layer. To solve this problem, the touch buffer layer 1190 may be formed on the encapsulation layer. A touch line is formed on the encapsulation layer. The touch line is formed on a slope surface of the encapsulation layer and the touch line has a corresponding slope.

The touch buffer layer 1190 may be formed of an inorganic film. The function of the touch buffer layer 1190 is not limited to preventing the encapsulation layer from being damaged in the process of forming the touch electrode.

The first touch electrode 1210 and the second touch electrode 1230 may be formed on the touch buffer layer 1190. The touch insulation film 1220 may be disposed under the touch electrode 1230. The contact hole may be formed in the touch insulation film 1220. The second touch electrode 1230 may be connected to the first touch electrode 1210 through the contact hole. The protective layer 1240 may be formed on the second touch electrode 1230. The protective layer 1240 may be an organic film or an inorganic film.

The touch buffer layer 1190 and the second inorganic film 1180 may be formed by being patterned when the first touch electrode 1210 is formed. The signal line may be exposed by removing the second inorganic film 1180 and the touch buffer layer 1190 from the pad area 2000 by using the patterning process. The portion where the signal line is exposed may be referred to as the pad 1010. Accordingly, the area of the active area on the substrate 1100 can be widened and the area of the pad area can be reduced, thereby it is possible to implement the small bezel area structure.

After the first touch electrode 1210 is patterned, the touch insulation film 1220 is deposited. Then, the second touch electrode 123 may be patterned and formed on the touch insulation film 122. At this time, the second touch electrode 123 may be formed on the signal line 111*a* exposed in the pad area 2000. In addition, the signal line 1110*a* can be in contact with the second touch electrode 1230. Accordingly, the signal can be transmitted to the second touch electrode 1230 through the signal line 1110*a*.

Figure 11:
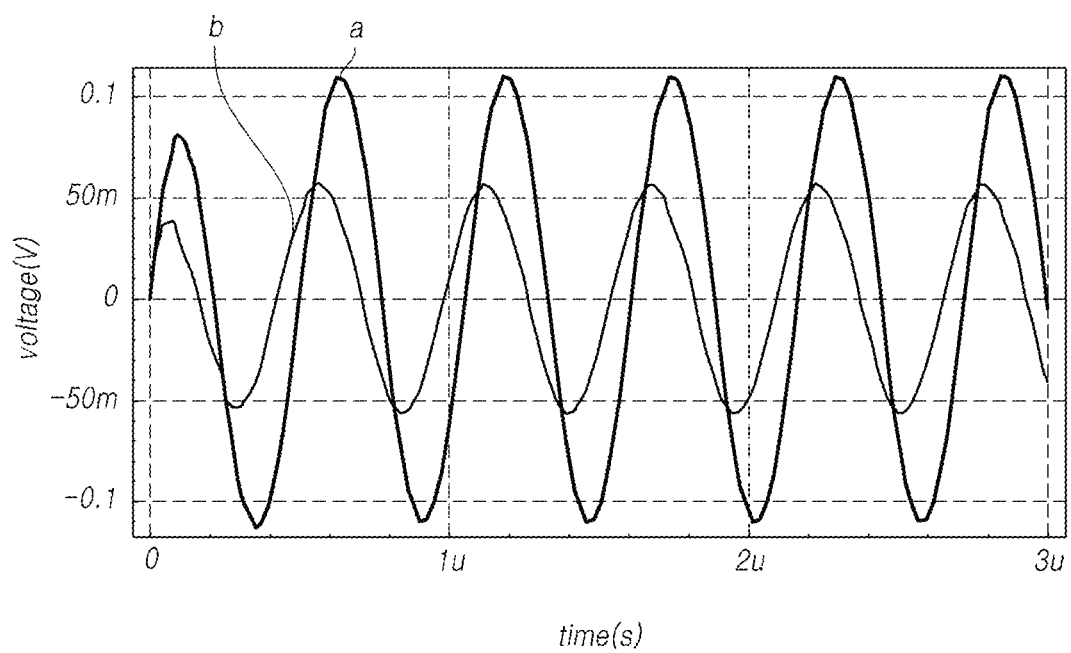
FIG. 11 is a graph comparing noise measured on a touch line in the display apparatus shown in FIG. 8 and the display apparatus shown in FIG. 9A.

FIG. 11 is a graph comparing noise measured on a touch line in the display apparatus shown in FIG. 8 and the display apparatus shown in FIG. 9A.

FIG. 11 illustrates the result of comparing the noise measured on the touch line of the display device. To measure the noise, a sinusoidal wave was applied to the drive line. The sinusodal wave applied to the driving line may be transferred to the touch line by the capacitors formed between the driving line and the touch line. In FIG. 11, the curve 'a' represents the sinusodal wave measured at the touch line of the display device shown in FIG. 8, and the curve 'b' represents the sinusodal wave measured at the touch line of the display device shown in FIG. 9A.

With reference to FIG. 11, it can be seen that the maximum value of the curve 'b' is smaller than the maximum value of the curve 'a'. For example, the size of the capacitor formed between the touch line and the driving line may be reduced by the shield layer 916*b* formed as shown in FIG. 9A, so that the touch line may be less affected by noise. Here, although the sinusodal wave is applied with noise, the noise can be transmitted as a rectangular wave. The waveform of the noise is not limited thereto.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
a substrate including an active area and a non-active area;
a plurality of data lines and a plurality of gate lines on the substrate;
a driving line in the non-active area configured to transfer a display driving signal to the active area;
a plurality of pixels electrically connected to the plurality of data lines and the plurality of gate lines, each pixel including:
a light emitting diode having an anode, a light emitting layer, and a cathode, and a driving transistor configured to drive the light emitting diode, wherein the driving line is under the cathode in the non-active area;
a shield layer between the cathode and the driving line;
an encapsulation layer on the cathode;
a touch electrode on the encapsulation layer in the active area, the encapsulation layer having a sloped surface;
a first power line in the non-active area electrically connected to the cathode and comprising a same material as the anode;
a second power line disposed in a same material layer as a source/drain electrode of the driving transistor and electrically connected to the first power line;
a third power line disposed in a same material layer as a gate of the driving transistor;
a touch line on the encapsulation layer in the non-active area and configured to supply a touch signal to the touch electrode, and
a plurality of pads in the non-active area,
wherein at least one pad of the plurality of pads is electrically connected to the touch electrode via the touch line,
wherein the driving line is below the touch line in the non-active area,
wherein the touch line is on the sloped surface of the encapsulation layer, thereby having a corresponding slope,
wherein the shield layer is spaced apart from the first power line in a same material layer as the first power line,
wherein the driving line is spaced apart from the third power line in a same material layer as the third power line, and
wherein the plurality of pads have a first pad electrode disposed in a same material layer as the second power line, and a second pad electrode disposed on the first pad electrode and in a same material layer as the touch electrode.

2. The display apparatus of claim 1, wherein the third power line is in the non-active area and electrically connected to the second power line.

3. The display apparatus of claim 2, wherein the third power line includes two electrodes spaced apart from each other and one of the two electrodes is grounded.

4. The display apparatus of claim 1, wherein the gate of the driving transistor is under the source/drain electrode of the driving transistor.

5. The display apparatus of claim 1, wherein the touch electrode includes a mesh-type touch electrode having an opening that is vertically aligned with the light emitting layer.

6. The display apparatus of claim 1, further comprising a dam area on the non-active area, wherein the touch line crosses over the dam area.

7. The display apparatus of claim 1, wherein the display driving signal is at least one of a data signal, a gate signal, a clock signal, a first voltage, a second voltage, and a ground.

8. The display apparatus of claim 1, wherein the shield layer is arranged between the anode and the first power line on a same layer as the anode.

9. The display apparatus of claim 7, wherein the shield layer includes a same material as the anode.

10. The display apparatus of claim 1, wherein a predetermined voltage is applied to the shield layer.

11. The display apparatus of claim 1, wherein the shield layer is grounded.

12. A display apparatus, comprising:
a substrate defining an active area having a plurality of pixels therein and a non-active area having a driving line configured to transfer a display driving signal to the active area to drive the pixels, each of the plurality of pixels including:
a light emitting diode having an anode electrode, a light emitting layer, and a cathode electrode, and
a driving transistor configured to drive the light emitting diode;
a touch electrode on the substrate corresponding to the active area;
a touch line on the substrate corresponding to the non-active area and configured to supply a touch signal to the touch electrode, the driving line being below the touch line in the non-active area;
an encapsulation layer on the cathode electrode;
a first power line in the non-active area electrically connected to the cathode electrode and comprising a same material as the anode electrode;
a second power line disposed in a same material layer as a source/drain electrode of the driving transistor and electrically connected to the first power line;
a third power line disposed in a same material layer as a gate of the driving transistor;
a shield layer between the touch line and the driving line, and
a plurality of pads in the non-active area,
wherein at least one pad of the plurality of pads is electrically connected to the touch electrode via the touch line,
wherein the shield layer is spaced apart from the first power line in a same material layer as the first power line,
wherein the driving line is spaced apart from the third power line in a same material layer as the third power line, and
wherein the plurality of pads have a first pad electrode disposed in a same material layer as the second power line, and a second pad electrode disposed on the first pad electrode and in a same material layer as the touch electrode.

13. The display apparatus of claim 12, wherein the shield layer includes a same material as the anode electrode and is on a same layer as the anode electrode.

14. A display apparatus, comprising:
a substrate defining an active area having pixels therein and a non-active area having driving lines therein configured to transfer a display driving signal to drive the pixels;
a thin film transistor on the substrate disposed corresponding to the active area;
a first insulation film on the thin film transistor;

an anode electrode on the first insulation film in the active area and connected to the thin film transistor through the first insulation film;

a shield layer on the first insulation film in the non-active area;

a first power line on the first insulation film in the non-active area and spaced apart from the shield layer and disposed in a same material layer as a source/drain electrode of the driving transistor;

a light emitting layer on the anode electrode;

a cathode electrode on the light emitting layer and connected to the first power line;

a second insulation film on the cathode electrode;

a second power line in the non-active area electrically connected to the cathode electrode and comprising a same material as the anode electrode, the second power line electrically connected to the first power line;

a third power line disposed in a same material layer as a gate of the thin film transistor and including two electrodes spaced apart from each other in the non-active area, one of the two electrodes directly contacting the substrate and the other of the two electrodes connected to the first power line;

a touch electrode on the second insulation film in the active area;

a touch line on the second insulation film in the non-active area and configured to supply a touch signal to the touch electrode; and a plurality of pads in the non-active area, wherein at least one pad of the plurality of pads is electrically connected to the touch electrode via the touch line, wherein the shield layer is spaced apart from the first power line in a same material layer as the first power line, wherein the driving line is spaced apart from the third power line in a same material layer as the third power line, and wherein the plurality of pads have a first pad electrode disposed in a same material layer as the second power line, and a second pad electrode disposed on the first pad electrode and in a same material layer as the touch electrode.

15. The display apparatus of claim 14, wherein the shield layer includes a same material as the anode electrode and is on a same layer as the anode electrode.

* * * * *